United States Patent
Chen et al.

(10) Patent No.: US 10,684,726 B2
(45) Date of Patent: Jun. 16, 2020

(54) CAPACITIVE TOUCH SENSING CIRCUIT AND CHARGE COMPENSATION METHOD THEREOF

(71) Applicant: Raydium Semiconductor Corporation, Hsinchu (TW)

(72) Inventors: Chih-Hsiung Chen, Zhubei (TW); Yu-Chin Hsu, Hsinchu (TW); Chih Yuan, New Taipei (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 0 days.

(21) Appl. No.: 16/155,584

(22) Filed: Oct. 9, 2018

(65) Prior Publication Data

US 2019/0107919 A1 Apr. 11, 2019

Related U.S. Application Data

(60) Provisional application No. 62/570,700, filed on Oct. 11, 2017.

(51) Int. Cl.
*G06F 3/041* (2006.01)
*H03K 17/96* (2006.01)
*G06F 3/044* (2006.01)

(52) U.S. Cl.
CPC ............ *G06F 3/0418* (2013.01); *G06F 3/044* (2013.01); *H03K 17/962* (2013.01); *H03K 2217/960725* (2013.01)

(58) Field of Classification Search
CPC ..... G06F 3/0418; G06F 3/044; H03K 17/962; H03K 2217/960725
See application file for complete search history.

(56) References Cited

U.S. PATENT DOCUMENTS

| 8,976,151 B2* | 3/2015 | Tan | G01R 27/2605 345/174 |
| 10,360,429 B2* | 7/2019 | Zhang | G06K 9/0002 |
| 2009/0315858 A1* | 12/2009 | Sato | G06F 3/0416 345/174 |
| 2010/0245286 A1* | 9/2010 | Parker | G06F 3/0416 345/174 |

(Continued)

*Primary Examiner* — Jose R Soto Lopez

(57) ABSTRACT

A capacitive touch sensing circuit includes a first switch~a fifth switch, an internal capacitor, an integrator and a capacitor. The first switch and an external capacitor are coupled in series between a first voltage and a ground voltage, one terminal of the second switch is coupled between the first switch and the external capacitor, and one terminal of the third switch is coupled to the other terminal of the second switch. The fourth switch and the internal capacitor are coupled in series between a second voltage and the ground voltage, wherein the second voltage is a negative value of the first voltage, and one terminal of the fifth switch is coupled to the other terminal of the second switch and the other terminal of the fifth switch is coupled between the fourth switch and the internal capacitor. One input terminal of the integrator is coupled to the other terminal of the third switch, the other input terminal of the integrator is coupled to a reference voltage, and the output terminal of the integrator outputs an output voltage. The capacitor is coupled between the input terminal and the output terminal of the integrator.

3 Claims, 3 Drawing Sheets

(56) References Cited

U.S. PATENT DOCUMENTS

| | | | | |
|---|---|---|---|---|
| 2010/0328262 A1* | 12/2010 | Huang | | G06F 3/0416 345/174 |
| 2011/0157072 A1* | 6/2011 | Chang | | G06F 3/0416 345/174 |
| 2011/0163768 A1* | 7/2011 | Kwon | | G06F 3/044 324/686 |
| 2011/0273400 A1* | 11/2011 | Kwon | | G06F 3/0416 345/174 |
| 2012/0218020 A1* | 8/2012 | Erdogan | | G01R 27/2605 327/337 |
| 2013/0002597 A1* | 1/2013 | Nishimura | | G06F 3/044 345/173 |
| 2013/0016057 A1* | 1/2013 | Nishimura | | G06F 3/044 345/173 |
| 2013/0021283 A1* | 1/2013 | Nishimura | | G06F 3/0416 345/173 |
| 2013/0027338 A1* | 1/2013 | Nishimura | | G06F 3/044 345/173 |
| 2013/0201154 A1* | 8/2013 | Yun | | G06F 3/044 345/174 |
| 2014/0049510 A1* | 2/2014 | Chung | | G06F 3/0416 345/174 |
| 2014/0085252 A1* | 3/2014 | Hanssen | | H03K 17/9622 345/174 |
| 2014/0152610 A1* | 6/2014 | Suwald | | G01D 5/24 345/174 |
| 2014/0176482 A1* | 6/2014 | Wei | | G06F 3/044 345/174 |
| 2015/0091845 A1* | 4/2015 | Park | | G06F 3/044 345/174 |
| 2015/0253372 A1* | 9/2015 | Watanabe | | G01N 27/223 324/538 |
| 2015/0309655 A1* | 10/2015 | Park | | G06F 3/044 345/173 |
| 2015/0346236 A1* | 12/2015 | Flamm | | G01P 15/125 73/514.32 |
| 2017/0116452 A1* | 4/2017 | Wang | | G06K 9/0002 |
| 2017/0192551 A1* | 7/2017 | Kim | | G06F 3/0418 |
| 2017/0269773 A1* | 9/2017 | Suzuki | | G06F 3/0416 |
| 2017/0293376 A1* | 10/2017 | Tang | | G06F 3/044 |
| 2017/0351380 A1* | 12/2017 | Ahn | | G06F 3/0418 |
| 2018/0004349 A1* | 1/2018 | Gicquel | | G06F 3/0418 |
| 2018/0121019 A1* | 5/2018 | Lee | | G06F 3/044 |
| 2018/0121700 A1* | 5/2018 | Zhang | | G06K 9/0002 |
| 2018/0144171 A1* | 5/2018 | Liang | | H03M 1/66 |
| 2018/0173342 A1* | 6/2018 | Lee | | G06F 3/044 |
| 2018/0181230 A1* | 6/2018 | Chang | | G06F 3/0416 |
| 2018/0260076 A1* | 9/2018 | Maharyta | | G06F 3/0418 |
| 2019/0107919 A1* | 4/2019 | Chen | | G06F 3/0418 |

* cited by examiner

CAPACITIVE TOUCH SENSING CIRCUIT AND CHARGE COMPENSATION METHOD THEREOF

BACKGROUND OF THE INVENTION

1. Field of the Invention

The invention relates to a touch panel; in particular, to a capacitive touch sensing circuit and a charge compensation method thereof applied to a capacitive touch panel.

2. Description of the Prior Art

In general, the capacitive touch panel can be designed in different types such as in-cell, on-cell or out-cell. In the process of using a capacitive touch panel, it is generally necessary to offset the external capacitor to improve the internal charge detection range.

However, as the external capacitance increases, the internal pre-filled capacitor must also increase with the same amount, resulting in a large increase in the area of the compensation capacitor required in the capacitive touch sensing circuit, which needs to be overcome.

SUMMARY OF THE INVENTION

Therefore, the invention provides a capacitive touch sensing circuit and a charge compensation method thereof applied to a capacitive touch panel to solve the above-mentioned problems of the prior arts.

A preferred embodiment of the invention is a capacitive touch sensing circuit. In this embodiment, the capacitive touch sensing circuit includes a first switch, a second switch, a third switch, a fourth switch, a fifth switch, an internal capacitor, an integrator and a capacitor. The first switch and an external capacitor are coupled in series between a first voltage and a ground voltage, one terminal of the second switch is coupled between the first switch and the external capacitor, and one terminal of the third switch is coupled to the other terminal of the second switch. The fourth switch and the internal capacitor are coupled in series between a second voltage and the ground voltage, wherein the second voltage is a negative value of the first voltage, and one terminal of the fifth switch is coupled to the other terminal of the second switch and the other terminal of the fifth switch is coupled between the fourth switch and the internal capacitor. One input terminal of the integrator is coupled to the other terminal of the third switch, the other input terminal of the integrator is coupled to a reference voltage, and the output terminal of the integrator outputs an output voltage. The capacitor is coupled between the input terminal and the output terminal of the integrator.

In an embodiment, the capacitive touch sensing circuit is operated in a first phase, a second phase, a third phase and a fourth phase in order.

In an embodiment, when the capacitive touch sensing circuit is operated in the first phase, the first switch and the fourth switch are conducted and the second switch, the third switch and the fifth switch are not conducted.

In an embodiment, when the capacitive touch sensing circuit is operated in the second phase, the second switch and the fifth switch are conducted and the first switch, the third switch and the fourth switch are not conducted.

In an embodiment, when the capacitive touch sensing circuit is operated in the third phase, the second switch and the fourth switch are conducted and the first switch, the third switch and the fifth switch are not conducted.

In an embodiment, when the capacitive touch sensing circuit is operated in the fourth phase, the second switch and the fifth switch are conducted and the first switch, the third switch and the fourth switch are not conducted.

In an embodiment, the capacitive touch sensing circuit is operated in the third phase and the fourth phase repeatedly until a voltage between the second switch and the fifth switch approaches the reference voltage and then the third switch is conducted and the first switch, the second switch, the fourth switch and the fifth switch are not conducted.

Another preferred embodiment of the invention is a charge compensation method. In this embodiment, the charge compensation method is applied to a capacitive touch sensing circuit. The capacitive touch sensing circuit includes a first switch, a second switch, a third switch, a fourth switch, a fifth switch, an internal capacitor, an integrator and a capacitor. The first switch and an external capacitor are coupled in series between a first voltage and a ground voltage, one terminal of the second switch is coupled between the first switch and the external capacitor, and one terminal of the third switch is coupled to the other terminal of the second switch. The fourth switch and the internal capacitor are coupled in series between a second voltage and the ground voltage, wherein the second voltage is a negative value of the first voltage, and one terminal of the fifth switch is coupled to the other terminal of the second switch and the other terminal of the fifth switch is coupled between the fourth switch and the internal capacitor. One input terminal of the integrator is coupled to the other terminal of the third switch, the other input terminal of the integrator is coupled to a reference voltage, and the output terminal of the integrator outputs an output voltage. The capacitor is coupled between the input terminal and the output terminal of the integrator.

The charge compensation method includes steps of: (a) when the capacitive touch sensing circuit is operated in the first phase, the first switch and the fourth switch are conducted and the second switch, the third switch and the fifth switch are not conducted; (b) when the capacitive touch sensing circuit is operated in the second phase, the second switch and the fifth switch are conducted and the first switch, the third switch and the fourth switch are not conducted; (c) when the capacitive touch sensing circuit is operated in the third phase, the second switch and the fourth switch are conducted and the first switch, the third switch and the fifth switch are not conducted; and (d) when the capacitive touch sensing circuit is operated in the fourth phase, the second switch and the fifth switch are conducted and the first switch, the third switch and the fourth switch are not conducted.

Compared to the prior art, the capacitive touch sensing circuit and the charge compensation method thereof applied to the capacitive touch panel according to the present invention can utilize the charge compensation mechanism of repeatedly compensating the external capacitor to effectively offset the relatively large external capacitance by the relatively small capacitance inside the circuit. So that it can be applied to the capacitive sensing environment under heavy load, effectively reducing the compensation capacitance area required in the capacitive touch sensing circuit and indeed improving the internal capacitance sensing range.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

A preferred embodiment of the invention is a capacitive touch sensing circuit applied to a capacitive touch panel. In this embodiment, the capacitive touch sensing circuit is configured to sense a capacitance change of an external capacitance to be detected when the capacitive touch panel is touched and to suppress external environmental noise. The structure of the capacitive touch panel can be designed in different types such as in-cell, on-cell or out-cell.

Figure 1:
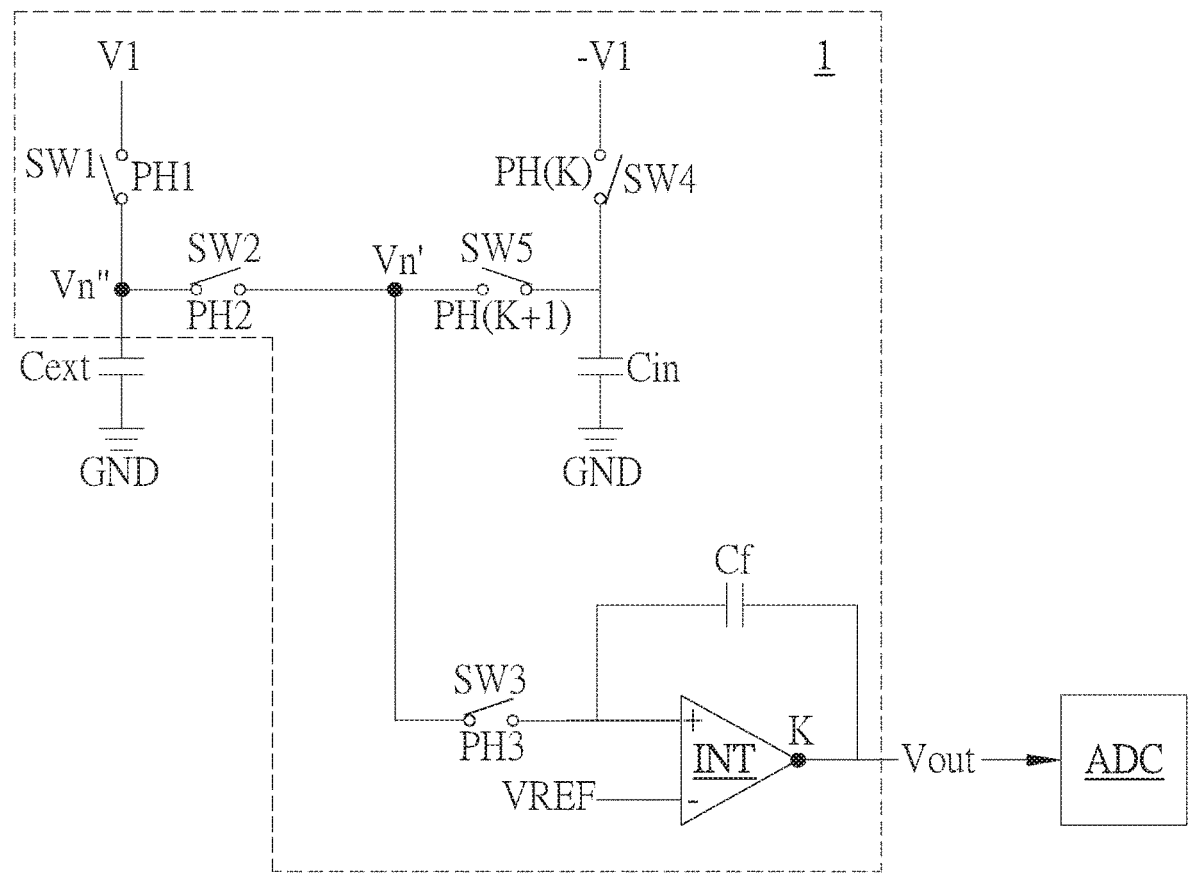
FIG. 1 illustrates a schematic diagram of the capacitive touch sensing circuit in a preferred embodiment of the invention.

Please refer to FIG. 1. FIG. 1 illustrates a schematic diagram of the capacitive touch sensing circuit in this embodiment.

As shown in FIG. 1, the capacitive touch sensing circuit 1 is coupled to an external capacitor Cext to be detected and an analog-to-digital converter ADC. The capacitive touch sensing circuit 1 includes a first switch SW1, a second switch SW2, a third switch SW3, a fourth switch SW4, a fifth switch SW5, an internal capacitor Cin, an integrator INT and a capacitor Cf. The first switch SW1, the second switch SW2, the third switch SW3, the fourth switch SW4 and the fifth switch SW5 are respectively controlled by a first control signal PH1, a second control signal PH2, a third control signal PH3, and a fourth control signal PH (K) and a fifth control signal PH (K+1).

The first switch SW1 and the external capacitor Cext are coupled in series between the first voltage V1 and the ground voltage GND. One terminal of the second switch SW2 is coupled between the first switch SW1 and the external capacitor Cext. One terminal of the third switch SW3 is coupled to the other terminal of the second switch SW2. The fourth switch SW4 and the internal capacitor Cin are coupled in series between the second voltage (−V1) and the ground voltage GND, and the second voltage (−V1) is a negative value of the first voltage V1. One terminal of the fifth switch SW5 is coupled to the other terminal of the second switch SW2 and the other terminal of the fifth switch SW5 is coupled between the fourth switch SW4 and the internal capacitor Cin. The input terminal + of the integrator INT is coupled to the other terminal of the third switch SW3, the input terminal − of the integrator INT is coupled to the reference voltage VREF and the output terminal K of the integrator INT outputs an output voltage Vout to the analog-to-digital converter ADC. The capacitor Cf is coupled between the input terminal + and the output terminal K of the integrator INT.

In this embodiment, the capacitive touch sensing circuit 1 will be operated in the first phase, the second phase, the third phase and the fourth phase. The detail will be described as follows:

When the capacitive touch sensing circuit 1 is operated in the first phase, the first switch SW1 and the fourth switch SW4 are respectively controlled by the first control signal PH1 and the fourth control signal PH(K) to be conducted, and the second switch SW2, the third switch SW3 and the fifth switch SW5 are respectively controlled by the second control signal PH2, the third control signal PH3 and the fifth control signal PH(K+1) to be non-conducted. Since the first switch SW1 is conducted, the first voltage V1 can charge the external capacitor Cext, and the amount of charge stored in the external capacitor Cext is Cext*V1. Similarly, since the fourth switch SW4 is conducted, the second voltage (−V1) can charge the internal capacitor Cin, and the amount of charge stored in the internal capacitor Cin is Cin*(−V1).

When the capacitive touch sensing circuit 1 is operated in the second phase, the second switch SW2 and the fifth switch SW5 are respectively controlled by the second control signal PH2 and the fifth control signal PH(K+1) to be conducted, and the first switch SW1, the third switch SW3, and the fourth switch SW4 are respectively controlled by the first signal PH1, the third control signal PH3 and the fourth control signal PH(K) respectively to be non-conducted. Since the second switch SW2 and the fifth switch SW5 are both conducted, the external capacitor Cext storing the charge amount Cext*V1 and the internal capacitor Cin storing the charge amount Cin*(−V1) can be connected to each other, so that the voltage level of them becomes V1' and V1'=(Cext−Cin)*V1/(Cext+Cin).

When the capacitive touch sensing circuit 1 is operated in the third phase, the second switch SW2 and the fourth switch SW4 are respectively controlled by the second control signal PH2 and the fourth control signal PH(K) to be conducted, and the first switch SW1, the third switch SW3 and the fifth switch SW5 are respectively controlled by the first control signal PH1, the third control signal PH3 and the fifth control signal PH(K+1) to be non-conducted. Since the fifth switch SW5 is not conducted, the external capacitor Cext is not coupled to the internal capacitor Cin, and since the first switch SW1 is not conducted, the first voltage V1 does not charge the external capacitor Cext, so that the external capacitor Cext is maintained at the voltage level V1'. In addition, since the fourth switch SW4 is conducted, the second voltage (−V1) can charge the internal capacitor Cin again, so the voltage level of the internal capacitor Cin becomes (−V1).

When the capacitive touch sensing circuit 1 is operated in the fourth phase, the second switch SW2 and the fifth switch SW5 are respectively controlled by the second control signal PH2 and the fifth control signal PH(K+1) to be conducted, and the first switch SW1, the third switch SW3 and the fourth switch SW4 are respectively controlled by the first control signal PH1, the third control signal PH3 and the fourth control signal PH(K) to be non-conducted. Since the second switch SW2 and the fifth switch SW5 are both conducted, the external capacitor Cext storing the charge amount Cext*V1' and the internal capacitor Cin storing the charge amount Cin*(−V1) can be connected to each other, and the voltage level of them becomes V2' and V2'=(Cext*V1'−Cin*V1)/(Cext+Cin).

Then, the capacitive touch sensing circuit 1 can be operated in the third phase and the fourth phase n times until the voltage Vn' between the second switch SW2 and the fifth switch SW5 approaches the reference voltage VREF, and Vn'=[Cext*V(n−1)'−Cin*V1]/(Cext+Cin). At this time, the capacitive touch sensing circuit 1 controls the third switch SW3 to be conducted through the third control signal PH3 and controls the first switch SW1, the second switch SW2, the fourth switch SW4 and the fifth switch SW5 to be non-conducted through the first control signal PH1, the second control signal PH2, the fourth control signal PH(K) and the fifth control signal PH(K+1) respectively. Since the positive input terminal + and the negative input terminal − of the integrator INF respectively receive the voltage Vn' and the reference voltage VREF and the voltage Vn' approaches the reference voltage VREF, the voltage change amount of the integrator INF will approach 0. Therefore, after the output voltage Vout outputted by the integrator INF is converted into the digital signal by the analog-to-digital converter ADC, it will be located at the output midpoint which can cover the largest variation range.

It should be noted that the number n of times that the capacitive touch sensing circuit 1 and repeatedly operated in the third phase and the fourth phase and the frequency thereof will be related to the resistance-capacitance value of the overall path in the circuit and the ratio of the internal capacitance value to the external capacitance value, not limited to a specific number of times or frequency.

In addition, in the above embodiment, although the time point at which the third switch SW3 is conducted occurs after the end of the multiple charge compensations, in fact, the time point at which the third switch SW3 is conducted can occur before the multiple charge compensations or during the multiple charge compensations. There are no specific restrictions.

Another preferred embodiment of the invention is a charge compensation method. In this embodiment, the charge compensation method is applied to a capacitive touch sensing circuit. The capacitive touch sensing circuit includes a first switch, a second switch, a third switch, a fourth switch, a fifth switch, an internal capacitor, an integrator and a capacitor. The first switch and an external capacitor are coupled in series between a first voltage and a ground voltage, one terminal of the second switch is coupled between the first switch and the external capacitor, and one terminal of the third switch is coupled to the other terminal of the second switch. The fourth switch and the internal capacitor are coupled in series between a second voltage and the ground voltage, wherein the second voltage is a negative value of the first voltage, and one terminal of the fifth switch is coupled to the other terminal of the second switch and the other terminal of the fifth switch is coupled between the fourth switch and the internal capacitor. One input terminal of the integrator is coupled to the other terminal of the third switch, the other input terminal of the integrator is coupled to a reference voltage, and the output terminal of the integrator outputs an output voltage. The capacitor is coupled between the input terminal and the output terminal of the integrator.

Figure 2:
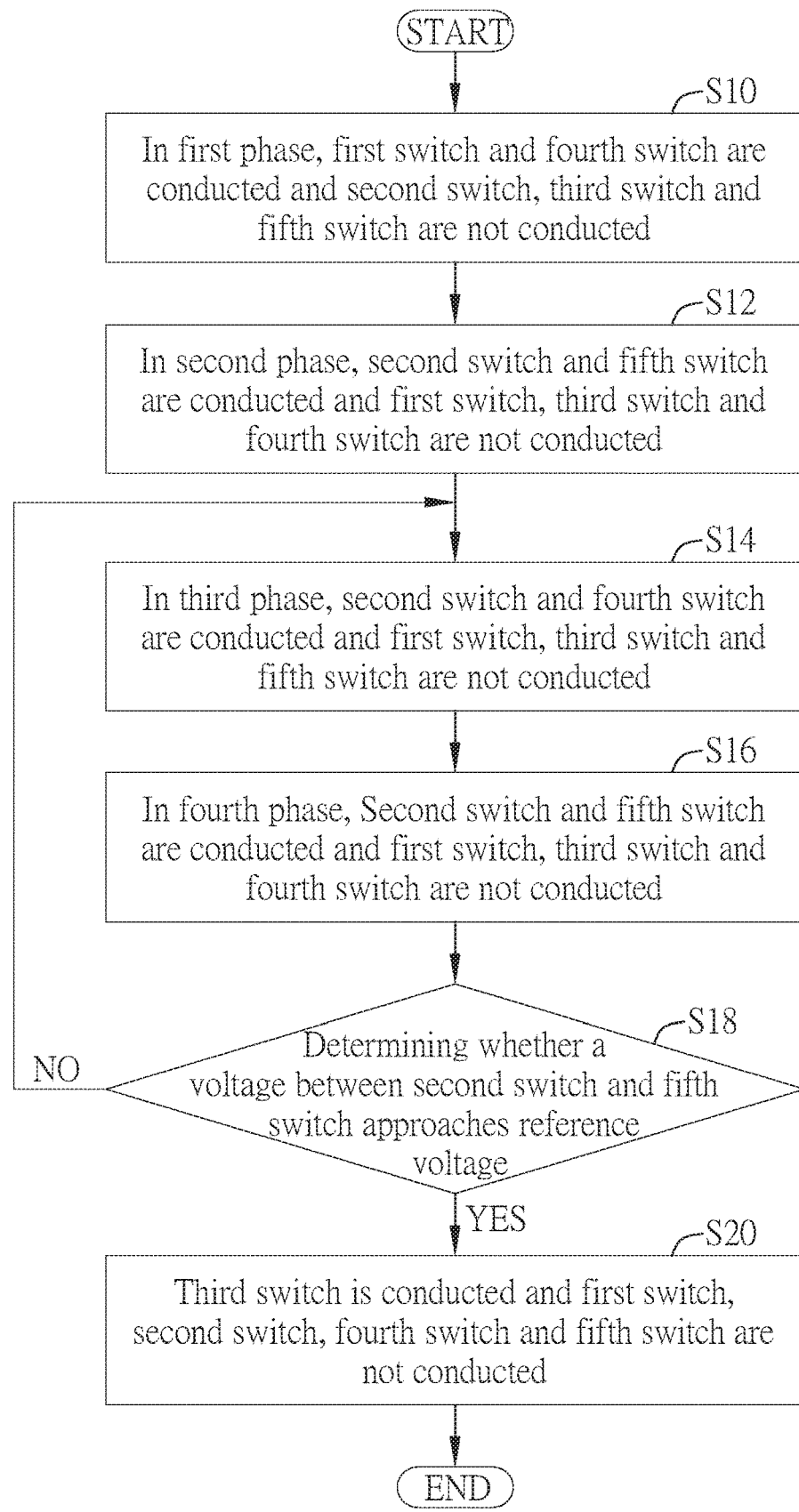
FIG. 2 illustrates a flowchart of the charge compensation method in another preferred embodiment of the invention.

Please refer to FIG. 2. FIG. 2 illustrates a flowchart of the charge compensation method in this embodiment.

As shown in FIG. 2, the charge compensation method applied to the capacitive touch sensing circuit can include steps of:

step S10: when the capacitive touch sensing circuit is operated in the first phase, the first switch and the fourth switch are conducted and the second switch, the third switch and the fifth switch are not conducted;

step S12: when the capacitive touch sensing circuit is operated in the second phase, the second switch and the fifth switch are conducted and the first switch, the third switch and the fourth switch are not conducted;

step S14: when the capacitive touch sensing circuit is operated in the third phase, the second switch and the fourth switch are conducted and the first switch, the third switch and the fifth switch are not conducted;

step S16: when the capacitive touch sensing circuit is operated in the fourth phase, the second switch and the fifth switch are conducted and the first switch, the third switch and the fourth switch are not conducted;

step S18: determining whether a voltage between the second switch and the fifth switch approaches the reference voltage;

if the determination result of the step S18 is no, then repeating the steps S14 and S16; and if the determination result of the step S18 is yes, then step S20 is performed to conduct the third switch and the first switch, the second switch, the fourth switch and the fifth switch are not conducted.

Figure 3:
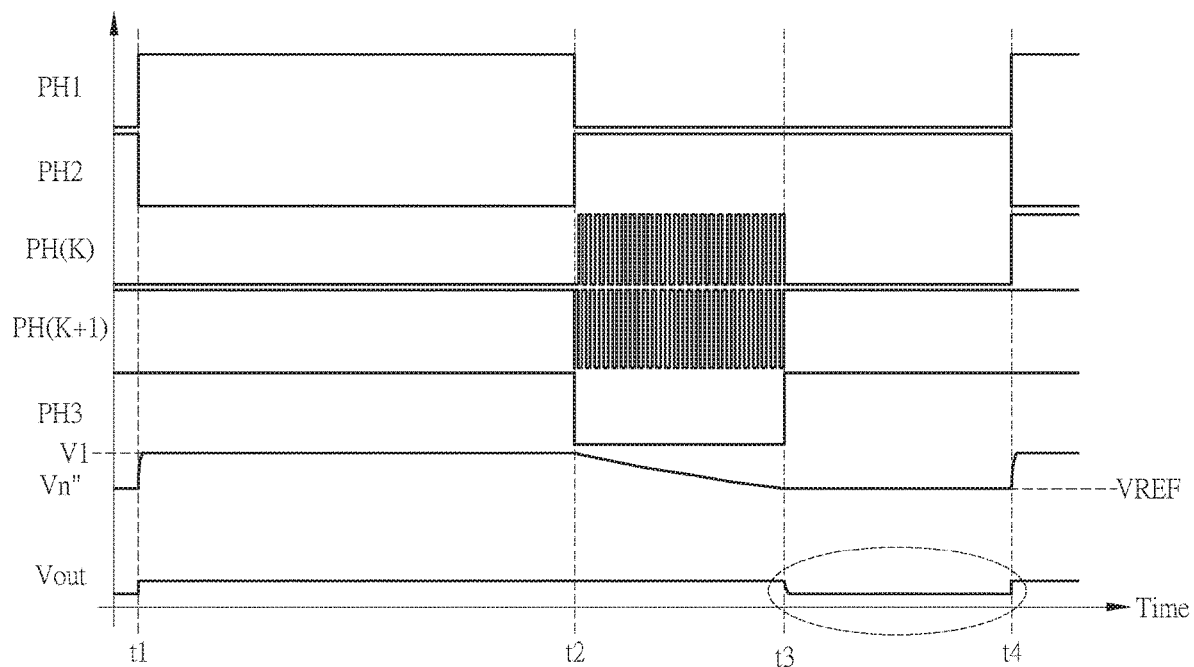
FIG. 3 illustrates timing diagrams of the first control signal PH1, the second control signal PH2, the third control signal PH3, the fourth control signal PH(K), the fifth control signal PH(K+1), the voltage Vn" between the first switch and the external capacitor and the output voltage Vout in an embodiment respectively.

Please refer to FIG. 3. FIG. 3 illustrates timing diagrams of the first control signal PH1, the second control signal PH2, the third control signal PH3, the fourth control signal PH(K), the fifth control signal PH(K+1), the voltage Vn" between the first switch SW1 and the external capacitor Cext and the output voltage Vout in an embodiment respectively.

As shown in FIG. 3, at the first time t1, when the first control signal PH1 is pulled up, the voltage Vn" between the first switch SW1 and the external capacitor Cext will be pulled to the first voltage V1 (e.g., 3 volts). At the second time t2, when the second control signal PH2 is pulled up, the voltage Vn between the first switch SW1 and the external capacitor Cext will be stably pulled down to approach the reference voltage VREF (e.g., 1.5 volts) by repeatedly switching the fourth control signal PH(K) and the fifth control signal PH(K+1). Assuming that the voltage Vn" drops to approach the reference voltage VREF at the third time t3, then the third control signal PH3 is pulled up at the third time t3 such that the voltage Vn" is equal to the reference voltage VREF (e.g., 1.5 volts), and the resulting charge change will cause the voltage change of the output voltage Vout as shown in the circle in FIG. 3.

Compared to the prior art, the capacitive touch sensing circuit and the charge compensation method thereof applied to the capacitive touch panel according to the present invention can utilize the charge compensation mechanism of repeatedly compensating the external capacitor to effectively offset the relatively large external capacitance by the relatively small capacitance inside the circuit. So that it can be applied to the capacitive sensing environment under heavy load, effectively reducing the compensation capacitance area required in the capacitive touch sensing circuit and indeed improving the internal capacitance sensing range.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A capacitive touch sensing circuit, comprising:
  a first switch, coupled in series with an external capacitor between a first voltage and a ground voltage;
  a second switch, wherein one terminal of the second switch is coupled between the first switch and the external capacitor;
  a third switch, wherein one terminal of the third switch is coupled to the other terminal of the second switch;
  an internal capacitor;

a fourth switch, coupled in series with the internal capacitor between a second voltage and the ground voltage, wherein the second voltage is a negative value of the first voltage;

a fifth switch, wherein one terminal of the fifth switch is coupled to the other terminal of the second switch and the other terminal of the fifth switch is coupled between the fourth switch and the internal capacitor;

an integrator, wherein one input terminal of the integrator is coupled to the other terminal of the third switch, the other input terminal of the integrator is coupled to a reference voltage, and the output terminal of the integrator outputs an output voltage; and a capacitor, coupled between the input terminal and the output terminal of the integrator;

wherein the capacitive touch sensing circuit is operated in a first phase, a second phase, a third phase and a fourth phase in order; when the capacitive touch sensing circuit is operated in the first phase, the first switch and the fourth switch are conducted and the second switch, the third switch and the fifth switch are not conducted; when the capacitive touch sensing circuit is operated in the second phase, the second switch and the fifth switch are conducted and the first switch, the third switch and the fourth switch are not conducted; when the capacitive touch sensing circuit is operated in the third phase, the second switch and the fourth switch are conducted and the first switch, the third switch and the fifth switch are not conducted; when the capacitive touch sensing circuit is operated in the fourth phase, the second switch and the fifth switch are conducted and the first switch, the third switch and the fourth switch are not conducted; the capacitive touch sensing circuit is operated in the third phase and the fourth phase repeatedly until a voltage between the second switch and the fifth switch approaches the reference voltage and then the third switch is conducted and the first switch, the second switch, the fourth switch and the fifth switch are not conducted.

2. A charge compensation method applied to a capacitive touch sensing circuit, the capacitive touch sensing circuit comprising a first switch, a second switch, a third switch, a fourth switch, a fifth switch, an internal capacitor, an integrator and a capacitor, the first switch and an external capacitor being coupled in series between a first voltage and a ground voltage, one terminal of the second switch being coupled between the first switch and the external capacitor, and one terminal of the third switch being coupled to the other terminal of the second switch, the fourth switch and the internal capacitor being coupled in series between a second voltage and the ground voltage, the second voltage being a negative value of the first voltage, and one terminal of the fifth switch being coupled to the other terminal of the second switch and the other terminal of the fifth switch being coupled between the fourth switch and the internal capacitor, one input terminal of the integrator being coupled to the other terminal of the third switch, the other input terminal of the integrator being coupled to a reference voltage, and the output terminal of the integrator outputting an output voltage, the capacitor being coupled between the input terminal and the output terminal of the integrator, the charge compensation method comprising steps of:

(a) when the capacitive touch sensing circuit is operated in a first phase, the first switch and the fourth switch being conducted and the second switch, the third switch and the fifth switch being not conducted;

(b) when the capacitive touch sensing circuit is operated in a second phase, the second switch and the fifth switch being conducted and the first switch, the third switch and the fourth switch being not conducted;

(c) when the capacitive touch sensing circuit is operated in a third phase, the second switch and the fourth switch being conducted and the first switch, the third switch and the fifth switch being not conducted;

(d) when the capacitive touch sensing circuit is operated in a fourth phase, the second switch and the fifth switch being conducted and the first switch, the third switch and the fourth switch being not conducted;

(e) determining whether a voltage between the second switch and the fifth switch approaches the reference voltage; and (f) if a determination result of the step (e) is no, then repeating the step (c) and the step (d).

3. The charge compensation method of claim 2, further comprising steps of:

(g) if a determination result of the step (e) is yes, then the third switch is conducted and the first switch, the second switch, the fourth switch and the fifth switch are not conducted.

* * * * *